(12) United States Patent  
Decroupet et al.

(10) Patent No.: US 7,494,717 B2
(45) Date of Patent: Feb. 24, 2009

(54) GLAZING PANEL CARRYING A COATING STACK

(75) Inventors: Daniel Decroupet, Jumet (BE);
Jean-Michel Depauw, Jumet (BE)

(73) Assignee: AGC Flat Glass Europe SA (BE)

( * ) Notice: Subject to any disclaimer, the term of this patent is extended or adjusted under 35 U.S.C. 154(b) by 358 days.

(21) Appl. No.: 10/545,230

(22) PCT Filed: Feb. 3, 2004

(86) PCT No.: PCT/EP2004/050073

§ 371 (c)(1),
(2), (4) Date: Aug. 12, 2005

(87) PCT Pub. No.: WO2004/071984

PCT Pub. Date: Aug. 26, 2004

(65) Prior Publication Data

US 2006/0139783 A1    Jun. 29, 2006

(30) Foreign Application Priority Data

Feb. 14, 2003   (EP)   ................................. 03003397

(51) Int. Cl.
*B32B 9/00* (2006.01)
(52) U.S. Cl. ....................... 428/428; 428/432; 428/698; 428/702; 428/704
(58) Field of Classification Search ................ 428/428, 428/432, 698, 699, 701, 702, 704
See application file for complete search history.

(56) References Cited

U.S. PATENT DOCUMENTS 6,355,334 B1 * 3/2002 Rondeau et al. ............ 428/212
2003/0165694 A1 * 9/2003 Hartig et al. ................ 428/428

* cited by examiner

*Primary Examiner*—Timothy M Speer
(74) *Attorney, Agent, or Firm*—Akerman Senterfitt

(57) ABSTRACT

A glazing panel has a coating stack comprising in sequence at least a base antireflective layer, an infra-red reflecting layer, a top antireflective layer and a top coat layer comprising at least one material selected from the group consisting of nitrides, oxynitrides, carbides, oxycarbides and carbonitrides of the elements of groups IVb, Vb and VIb of the periodic table.

20 Claims, 2 Drawing Sheets

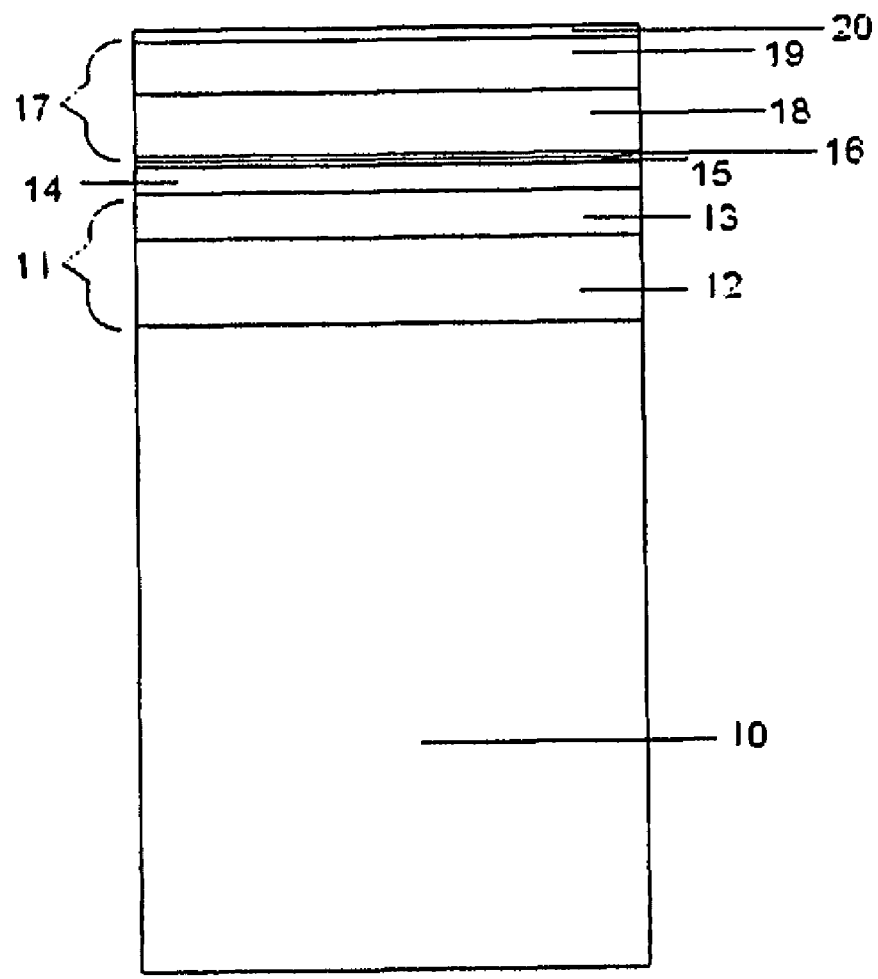

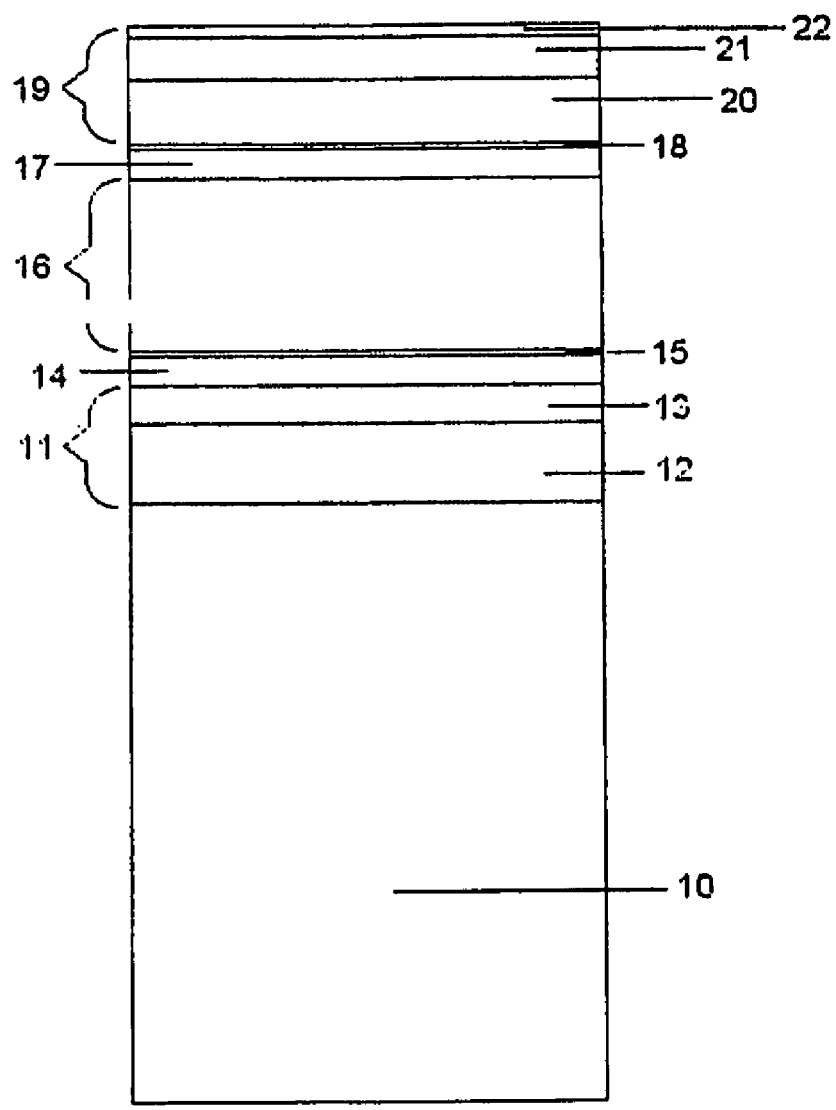

GLAZING PANEL CARRYING A COATING STACK

CROSS-REFERENCE TO RELATED APPLICATIONS

This application is the entry into the U.S. National Stage of PCT Application No. PCT/EP2004/050073, filed Feb. 3, 2004, claiming priority from European Application EP 03003397.1 filed Feb. 14, 2003, the disclosures of both of which are hereby incorporated by reference.

BACKGROUND

This invention relates to glazing panels and particularly, but not exclusively, to solar control and/or low emissivity glazing panels which are intended to undergo heat treatment following application to the glazing substrate of an optical filter in the form of a coating stack.

The invention relates more particularly to cases where a coating stack is applied to the glazing by a vacuum deposition technique, for example by sputtering or magnetron sputtering.

Multiple factors must be considered when designing coating stacks for glazing applications. These incdude not only the desired opto-energetic performance of the coated glazing panel but also, for example, the abrasion resistance of the coating stack (to facilitate handling and processing), the stability and chemical durability of the coating stack (to facilitate storage under various conditions) and the tolerances of the control of the manufacturing process (to facilitate acceptable manufacturing yields and consistency between product runs).

It is known to apply a top coat to a coating stack particularly in an attempt to increase the abrasion resistance and/or chemical durability of a coatings stack The use of metallic layers (for example of chromium, nickel chromium or zinc) or dielectric layers (for example titanium oxide, silicon oxide, zinc oxide, silicon nitride, aluminium nitride) has been proposed in this context. However, many known non-metallic top coats suffer from insufficient chemical durability, whilst known metallic top coats can have a number of disadvantages.

SUMMARY

The present invention provides glazing panels, a method of manufacturing glazing panels and use of a top coat layer as defined in the independent claims. Preferred embodiments are defined in the dependent claims.

The present invention may provide an advantageous combination of good:

chemical durability, especially where the top coat comprises a nitride or an oxynitride humidity resistance, particularly when the top coat comprises titanium nitride stability of manufacturing parameters heat treatability The top coat layer is preferably the outermost, exposed layer of the coating stack.

The coating layers are preferably deposited by a vacuum deposition technique, particularly magnetron sputtering.

One advantage of the top coats of the present invention may be a combination of particularly good chemical durability during storage, for example prior to heat treatment and/or assembly, with a facility to control the manufacturing tolerances and production process. This may be combined with an ability to provide thermal protection to other parts of the coating stack during heat treatment With known metallic top coats:

Small variations in the thickness of a metallic top coat can significantly affect the properties of the heat treated coated glazing panel and/or the heat treatment conditions that must be used, especially if the metal is relatively difficult to oxidise during heat treatment.

If a highly reactive metal is used then this will partially oxidise in air during storage prior to heat treatment of the glazing panel. The extent of this oxidation may be difficult to control as it may depend upon the ambient temperature, the humidity and other storage conditions and even the temperature of the glazing panel when it first enters the atmosphere at the exit of a vacuum coating line (the glazing panel temperature will generally be lower for thicker substrates).

Consequently, It can be difficult to control the manufacturing tolerances and precise condition of an intermediate coated glazing panel that arrives to be heat treated. The significant difference in refractive index and/or extinction coefficient between a metal top coat before and after heat treatment may also renders the control of the thickness and heat treatment conditions critical to avoid unacceptable variations in properties such as light transmittance, energy transmittance and colour in the heat treated glazing panel.

Fine adjustment and control of the manufacturing tolerance of the thickness of the top coats of the present invention may be less critical to the variations of properties of the glazing panel; this may facilitate higher manufacturing yields and/or throughput. Furthermore, where the refractive indexes and/or extinction coefficients of the top coats of the present invention are reasonably similar both before and after heat treatment (for example with a variation in refractive index at 550 nm of less than 1, 0.8, 0.6. 0.5, 0.4, 0,3 or 0.2 due to heat treatment and/or a variation in extinction coefficient at 550 nm of less than 1,5; 1,4, 1,3, 1,2, 1, 0.8, 0.6. 0.5, 0.4, 0,3 or 0.2 due to heat treatment), the tolerance of one or more properties, for example, luminous transmittance, energy transmittance, luminous reflection, colour in reflection, colour in transmittance, may be less prone to significant variation as a function of the manufacturing tolerances and storage time and conditions of the intermediate product prior to heat treatment. The present invention may also facilitate the use of a substantially identical coating stack on glazing substrates of different thickness (for example, 2 mm, 4 mm, 6 mm, 8 mm thick glass sheets) which require different conditions for correct heat treatment.

The use of a nitride or oxynitride top coat according to certain embodiments of the present invention may facilitate deposition control; this may especially be the case when a vacuum coater used to manufacture the glazing panels has been exposed to the atmosphere for maintenance and must be purged of air and/or water vapour contamination. Given that air is about 80% nitrogen, air contamination may be less disruptive to deposition of these materials. The effect of air and/or water vapour contamination on deposition in a reactive nitrogen and/or oxygen containing atmosphere is less significant than equivalent contamination in an inert (eg argon) sputtering atmosphere used for the deposition of metal layers as, in the latter case, the contaminants are the only reactive species present in the deposition atmosphere.

Where the glazing panel carries a coating stack having a single silver or other infra-red reflecting metal layer and having, for example, the structure:

Glass
base antirefective dielectric layer
optional nucleation or barrier layer infra red reflective metal layer
optional barrier layer
top antireflective dielectric layer
top coat layer the base antireflective dielectric layer preferably has an optical thickness in the range of 50 nm to 80 nm whilst the combination of the top antireflective dielectric layer and the top coat layer preferably has an optical thickness in the range 50 nm to 100 nm.

Where the glazing panel carries a coating stack having a double silver or other infra-red reflecting metal layer and having, for example, the structure:

Glass
base antireflective dielectric layer
optional nucleation or barrier layer
infra red reflective metal layer
optional barrier layer
central antireflective dielectric layer
optional nucleation or barrier layer
infra red reflective metal layer
optional barrier layer
top antireflective dielectric layer
top coat layer the base antireflective dielectric layer preferably has an optical thickness In the range of 35 nm to 80 nm, the central antireflective dielectric layer preferably has an optical thickness in the range 130 nm to 180 nm and the combination of the top antireflective dielectric layer and the top coat layer preferably has an optical thickness in the range 40 nm to 80 nm.

The top coat layer may have a geometrical thickness of greater than or to equal to 10 Å, 15 Å, 20 Å or 25 Å; it may have a geometrical thickness of less than or equal to 100 Å, 80 Å, 70 Å, 60 Å or 50 Å. The top coat layer preferably has a geometrical thickness in the range 15 to 50 Å, more preferably 20 to 40 Å particularly where it comprises a nitride or an oxynitride of titanium. Such thicknesses may provide an optimisation for providing a desired corrosion resistance whilst simultaneously providing a top coating layer which will provide desired characteristics, for example refractive index and/or extinction coefficient, after heat treatment.

The filter stack may comprise one or more barrier layers underlying and/or overlying the infra red reflecting layer, as is known in the art. Barriers of, for example, one or more of the following material may be used. Ti, Zn, Cr, "stainless steel", Zr, Nb, Ni, NiCr, NiTi, ZnTi and ZnAl. Such barriers may be deposited, for example, as metallic layers or as sub-oxides (i.e. partially oxidised layers). Alternatively, nitrided barrier layers may also be used. Each barrier layer may consist of a single layer or may comprise two or more sub-layers which together form the barrier layer. The barrier layer may comprise a first barrier layer in substantially metallic form, e.g. comprising nickel and chromium, and an overlying second barrier layer of a different composition from the first barrier layer (e.g. comprising titanium) which is in a form selected from the group consisting of oxides, sub-stoichiometric oxides, nitrides, sub-stoichiometric nitrides, oxynitrides and sub-stoichiometric oxynitrides.

Each antireflective dielectric layer may consist of a single layer or may comprise two or more sub-layers which together form the antireflective dielectric layer. The top antireflective dielectric layer, or at least portion of the top antireflective dielectric layer which contacts the top coat layer may be of a material other than silicon nitride and/or other than aluminium nitride, it may comprise an oxide, for example an oxide comprising zinc and tin and/or zinc and aluminium.

The invention has particular utility in relation to glazing panels which,
when heat-treated will give a colour in reflection such that:
$a*$ is between $+2$ and $-10$, preferably between 0 and $-7$; and
$b*$ is between $+2$ and $-15$, preferably between 0 and $-10$;
or which
when heat-treated and assembled with a sheet of clear glass as double glazing units with the coating positioned inside the double glazing unit at position 2 (interior surface of exterior sheet of glass) or position 3 (interior surface of interior sheet of glass) will give a colour in reflection seen from the outside such that:
$a*$ is between 0 and $-7$, preferably between 0 and $-4$; and
$b*$ is between $+2$ and $-10$, preferably between 0 and $-7$.

Preferably, the glazing panels, when heat treated and presented in the form of monolithic glazing and/or in the form of assembled double glazing units provide a substantially neutral colour in reflection.

The combination of properties that may be provided by the present invention have particular advantages in relation to heat treatable and heat treated glazing panels. Nevertheless, the invention may also be used in respect of glazings which are not heat treated. The term "heat treatable glazing panel" as used herein means that the glazing panel carrying the coating stack is adapted to undergo a bending and/or thermal tempering and/or thermal hardening operation without the haze of the so treated glazing panel exceeding 0.5, and preferably without the haze exceeding 0.3. The term "substantially haze free heat treated glazing panel" as used herein means a glazing panel which has been bent and/or thermally tempered and/or thermally hardened and has a haze that does not exceed 0.5 and which preferably does not exceed 0.3. The thermal treatment may involve rising the temperature of the glazing panel to a temperature exceeding 400° C., 450° C., 500° C., 550° C., 600° C., 650° C. or 700° C.

Heat treatment may provoke an increase in the luminous transmittance (TL) of the glazing panel. Such an increase in TL may be advantageous in ensuring that TL is sufficiently high for the glazing panel to be used in high light transmittance glazings, for example, in vehicle windscreens or in architectural applications where the monolithic coated glazing panel is desired to have a TL greater than about 55%, 60%, 65%, 70%, 75%, 80% 85% or 90% or in double glazing units where the double glazing unit is desired to have a TL greater than about 55%, 60%, 65%, 70%, 75%, 80% or 85%. TL may increase in absolute terms during heat treatment by, for example, greater than about 2.5%, greater than about 3%, greater than about 4%, greater than about 5%, greater than about 8% or greater than about 10%.

The coating stack of the glazing panel of the present invention may be such that if applied to a clear sheet of 4 mm glass it would give a TL measured with Illuminant C of greater than about 55%, 60%, 65%, 70%, 75%, 80% 85% or 90% and/or an energetic transmittance (TE) (System Moon 2) of greater than about 35%, 40%, 50%, 55% or 60%. The coating stack may be responsible for a reduction of the TL of the glazing panel with in the range 10 to 20%. The energetic transmittance (System Moon 2) of the glazing panel may be greater than 40%, 45%, 50%, 55%, 60% or 65%. Such properties or combinations of properties may be particularly useful when the glazing panel is intended for use in low emissivity applications.

The coating stack of the glazing panel of the present invention may be such that if applied to a clear sheet of 4 mm glass it would give a combination of TL measured with Illuminant C and (TE) (System Moon 2) such that:

TL is greater than or equal to 70% and TE is less than or equal to 50%; or

TL is greater than or equal to 60% and TE is less than or equal to 42%; or

TL is greater than or equal to 50% and TE is less than or equal to 35%; or

TL is greater than or equal to 40% and TE is less than or equal to 30%.

Such a combination of properties may be useful where the glazing panel is intended for solar control applications.

The top coat layer of the present invention may undergo some transformation or oxidation when stored in air, for example prior to an intended heat treatment operation. For example, where the top coat layer is initially deposited in the form of titanium nitride or titanium oxynitride, at least the superficial portion of the top coat layer which is exposed to air during storage may oxidise to titanium oxide. A similar effect may occur with other top coat layers of the invention.

BRIEF DESCRIPTION OF THE DRAWINGS

Examples of the present invention will now be described with reference to FIG. 1 and FIG. 2 which are cross-sections through glazing panels prior to a bending and tempering operation (for ease of representation, the relative thicknesses of the glazing panel and coating layers are not shown to scale).

DETAILED DESCRIPTION

EXAMPLE 1

FIG. 1 shows a single Ag layer, heat treatable, coating layer deposited on a glass substrate by magnetron sputtering and having the following sequential structure:

| | Reference number | Geometrical thickness | Atomic ratios |
|---|---|---|---|
| Glass substrate | 10 | 4 mm | |
| Base antireflective layer comprising: ZnSnOx | 11 | | |
| ZnSnOx | 12 | 230 Å | Zn/Sn ≈ 2 |
| ZnSnOx | 13 | 120 Å | Zn/Sn ≈ 17 |
| Ag (infra red reflective layer) | 14 | 95 Å | |
| NiCr heat treatment barrier layer | 15 | 10 Å | |
| Ti deposition barrier layer | 16 | 20 Å | |
| Top antireflective layer comprising: | 17 | | |
| ZnSnOx | 18 | 130 Å | Zn/Sn ≈ 17 |
| ZnSnOx | 19 | 210 Å | Zn/Sn ≈ 2 |
| Top coat layer comprising TiN | 20 | 25 Å | |

In this type of structure, the Ag layer acts to reflect incident infra red radiation and in order to fulfil this role must be maintained as silver metal rather than silver oxide and must not be contaminated by adjacent layers. The dielectric antireflective layers which sandwich the Ag layer serve to reduce the reflection of the visible portion of the spectrum which the Ag layer would otherwise provoke. The heat treatment barrier serves to prevent degradation of the Ag layer during heat treatment of the glazing panel; it is usually at least partially oxidised in this process. The deposition barrier serves to prevent oxidation of the heat treatment barrier during sputtering of the overlying dielectric antireflective layer in an oxidising atmosphere; this barrier is at least partially oxidised during this process.

Properties of the glazing panel prior and subsequent to heat treatment process are:

| Property | Prior to heat treatment[see Note 1 below] | Following heat treatment[see Note 2 below] |
|---|---|---|
| TL (Illuminant C) | 77% | 87% |
| TE (System Moon 2) | 57.5% | 67% |
| haze | 0.08 | 0.16 |
| a* reflectance | −4 (coated side) | −3 (coated side) |
| b* reflectance | −17 (coated side) | −12 (coated side) |
| RE (System Moon 2) | 20% (coated side) | 22% (coated side) |

[Note 1] Measured for monolithic glazing panel with coating prior to heat treatment
[Note 2] Measured following a tempering heat treatment process at 680° C. (furnace temperature) for 8 minutes Heat treatment preferably causes substantially complete oxidation of the titanium nitride top coat layer.

The colour co-ordinates of the examples are particularly suited to architectural double glazing units as they give a neutral appearance in reflection.

Samples according to Example 1 were subjected prior to tempering to a Cleveland Condensation resistance test and a Climatic Chamber test (Cycled condensation resistance test).

The Cleveland test consists of subjecting the coated glass to a water-saturated atmosphere at constant temperature. The samples have condensation continually forming on them and it is this condensation that may cause surface degradation. A test cabinet (Cleveland) is placed in a room with an ambient temperature of 23° C. ±3. Care is taken to ensure that draughts and solar irradiation do not interfere with the test cabinet. The samples are mounted in a holder which forms the roof of the test cabinet. The floor of the test cabinet acts as the receptacle for the quantity of water. The test cabinet is conditioned only by heating the demineralised water on the floor with heating resistances controlled by means of a thermocouple, keeping a temperature of the water of 50°C. ±2. The samples are subjected to the test during 24 hours.

The Climatic chamber test consists of subjecting the samples in an atmosphere maintained at 98% relative humidity to a continuous cycle of a) increasing temperature from 45° C. to 55° C. over the space of one hour and b) subsequently decreasing the temperature from 55° C. to 45° C. over the space of one hour. This cycle is repeated for a period of three days. The test may be carried out in a 500 litre Weiss chamber.

Samples that have been subjected to each test are inspected for: a) punctual defects (diameter <0.5 mm) like needles, a limited density of which may be acceptable; b) large defects such as spots of corrosion a few mm in diameter which are unacceptable; c) dissolution of the coating which is unacceptable.

The following result were obtained:

| Test | Example 1 | Comparative example without top coat layer of Example 1 |
|---|---|---|
| Cleveland | No alteration | More than 20 spots per dm2 some of which of diameter greater than 1 mm |
| Climatic chamber | Less than 3 spots per dm2 of a diameter below 0.5 mm | More than 20 spots per dm2 some of which of diameter greater than 1 mm |
| Suitable for long duration storage | Yes | Borderline |

It is anticipated that variations to example 1 in which the material of the top coat layer Is selected from an alternative as defined in the claims will have similar performances in the Cleveland and Climatic chamber tests.

The coating stack used in example 1 was also applied to other glass sheets having thicknesses of 4 mm, 6 mm and 8 mm. These sheets were stored in a variety of condition and for various durations (1 month for the 6 mm, 3 months for the 4 mm, 5 months for the 8 mm samples) prior to being tempered and then assembled into double glazing units. Typical properties of these glazings were:

| Glass Thickness | TL (M) | L (M) | a (M) | b (M) | R (M) | L (DV) | a (DV) | b (DV) |
|---|---|---|---|---|---|---|---|---|
| 4 mm | 88.0 | 24.4 | −1.6 | −8.6 | 3.5 | 34.8 | −1.4 | −4.0 |
| 6 mm | 87.8 | 23.1 | −1.3 | −8.9 | 3.7 | 34.0 | −1.2 | −4.2 |
| 8 mm | 86.4 | 23.3 | −1.6 | −9.4 | 3.6 | 34.0 | −1.2 | −4.0 |

In which L, a and b are the colour coordinates on the Hunter scale, R is the resistance per square, (M) indicates properties of the tempered, monolithic glazing measured from the coated side i.e. coating in position 1 and (DV) indicates properties of a double glazing unit incorporating the tempered, coated glazing panel with a sheet of 4 mm clear glass, measured from the outside of the double glazing unit with the coating in position 3

This demonstrates the stability of these properties with respect of the glass thickness and the storage conditions.

EXAMPLE 2

FIG. 2 shows a double Ag layer, heat treatable, coating layer deposited on a glass substrate by magnetron sputtering and having the following sequential structure:

|  | Reference number | Geometrical thickness | Atomic ratios |
|---|---|---|---|
| Glass substrate | 10 | 2 mm | |
| Base dielectric comprising: AlN | 11 | | |
|  | 12 | 150 Å | |
| ZnAlOx | 13 | 160 Å | Al/Zn ≈ 0.1 |
| Ag | 14 | 100 Å | |
| ZnAl overlying barrier | 15 | 10 Å | Al/Zn ≈ 0.1 |
| Central dielectric comprising ZnAlOx | 16 | 790 Å | Al/Zn ≈ 0.05 |
| Ag | 17 | 110 Å | |
| ZnAl overlying barrier | 18 | 14 Å | Al/Zn ≈ 0.1 |
| Top dielectric comprising: | 19 | | |
| ZnAlOx | 20 | 170 Å | Al/Zn ≈ 0.05 |
| AlN | 21 | 85 Å | |
| Top coat layer comprising TiN | 22 | 30 Å | | in which ZnAlOx is a mixed oxide containing Zn and Al deposited in this example by reactively sputtering a target which is an alloy or mixture of Zn and Al in the presence of oxygen. The ZnAl barriers are similarly deposited by sputtering a target which is an alloy or mixture of Zn and Al in a substantially inert, oxygen free atmosphere.

At least a portion of the overlying barriers 15, 18 is oxidised during deposition of their overlying oxide layers. Nevertheless, a portion of these barriers preferably remains in metallic form, or at least in the form of an oxide that is not fully oxidised to provide a barrier for subsequent heat treatment of the glazing panel.

Properties of the glazing panel prior and subsequent to heat treatment process are:

| Property | Prior to heat treatment[Note 1 below] | Following heat treatment[Note 2 below] |
|---|---|---|
| TL (Illuminant A) | 55% | 76% |
| TE (System Moon 2) | | 43% |
| haze | 0.07 | 0.35 (including pvb haze) |
| a* | −9 (glass side) | −7 (glass side) |
| b* | +4 (glass side) | −6 (glass side) |
| RE (System Moon 2) | | 34% (glass side) |

[Note 1] Measured for monolithic glazing panel with coating prior to heat treatment
[Note 2] Measured following a tempering heat treatment process at 650° C. (furnace temperature) for 10 minutes and lamination with a 0.76 mm layer of pvb and a 2 mm sheet of clear glass Heat treatment preferably causes substantially complete oxidation of the titanium nitride top coat layer.

Prior to heat treatment, the coating stack of Example 2 also performs well in the Cleveland and Climatic chamber tests.

Additional layers may be introduced above, below or between the film stacking arrangement if desired without departing from the invention.

GLOSSARY

Unless otherwise indicated by the context, the terms listed below have the following meanings in this specification:

| | | |
|---|---|---|
| a* | | colour co-ordinate measured on the CIELab scale at normal incidence |
| Ag | silver | |
| Al | aluminium | |
| Al2O3 | aluminium oxide | |
| AlN | aluminium nitride | |
| b* | | colour co-ordinate measured on the CIELab scale at normal incidence |
| Cr | chromium | |
| haze | | the percentage of transmitted light which in passing through the specimen deviates from the incident beam by forward scattering, as measured in accordance with the ASTM Designation D 1003-61 (Reapproved 1988). |
| infra red reflecting material | | a material that has a reflectance higher than the reflectance of sodalime glass in the band of wavelenghts between 780 nm and 50 microns |
| Na | sodium | |
| Nb | niobium | |
| NiCr | | an alloy or mixture comprising nickel and chromium |
| NiTi | | an alloy or mixture comprising nickel and titanium |
| RE | energetic reflection | the solar flux (luminous and non-luminous) reflected from a substrate as a percentage of the incident solar flux |
| selectivity | | the ratio of the luminous transmittance to the solar factor i.e. TL/TE |
| Si02 | silicon oxide | |
| Si3N4 | silicon nitride | |
| SnO2 | tin oxide | |
| Ta | tantalum | |
| TE | energetic transmittance | the solar flux (luminous and non-luminous) transmitted through a substrate as a percentage of the incident solar flux |

| | | |
|---|---|---|
| Ti | titanium | |
| TL | luminous transmittance | the luminous flux transmitted through a substrate as a percentage of the incident luminous flux |
| Zn | zinc | |
| ZnAl | | an alloy or mixture comprising zinc and aluminium |
| ZnAlOx | | a mixed oxide containing zinc and aluminium |
| ZnAlOy | | a partially oxidised mixture comprising zinc and aluminium |
| ZnO | zinc oxide | |
| ZnTi | | an alloy or mixture comprising zinc and titanium |
| ZnTiOx | | a mixed oxide containing zinc and titanium |
| ZnTiOy | | a partially oxidised mixture comprising zinc and titanium |
| Zr | zirconium | |

The invention claimed is:

1. A glazing panel carrying a coating stack comprising in sequence at least:
   a glass substrate
   a base antireflective layer
   an infra-red reflecting layer,
   a top antireflective layer
   a top coat layer
   in which the glazing panel is adapted to be heat treated and in which the top coat layer comprises at least one material selected from the group consisting of nitrides, oxynitrides, oxycarbides and carbonitrides of the elements of groups IVb, Vb and VIb of the periodic table
   and in which the top coat layer has a geometrical thickness of greater than or equal to 10 Å and less than or equal to 100 Å.

2. A glazing panel in accordance with claim 1 which is adapted for assembly in a double glazing unit.

3. A glazing panel in accordance with claim 2, in which the glazing panel is adapted for assembly in a double glazing unit with the coating stack in position 3.

4. A glazing panel in accordance with claim 2, in which the glazing panel is adapted to be heat treated prior to assembly in a double glazing unit.

5. A double glazing unit comprising at least one heat-treated glazing panel in accordance with claim 1.

6. A double glazing unit in accordance with claim 5, in which the double glazing unit gives a colour in reflection seen from the outside such that a* is between 0 and −4 and b* is between 0 and −7.

7. A double glazing unit in accordance with claim 5, in which the double glazing unit has a luminous transmittance of greater than 70%.

8. A glazing panel in accordance with claim 1, including at least one of the following characteristics (a) through (c):
   (a) the coated glazing panel has a luminous transmittance of greater than 70%;
   (b) the coated glazing panel provides a substantially neutral colour in reflection;
   (c) a heat treatment provokes an increase in the luminous transmittance of the glazing panel.

9. A glazing panel in accordance with claim 1, includes at least one of the following (a) and (b):
   (a) at least one of the antireflective layers comprises an oxide; and
   (b) at least one of the antireflective layers comprises a mixed oxide of zinc and one or more of tin, aluminium and titanium.

10. A glazing panel in accordance with claim 1, the base antireflective layer comprising at least one layer comprising a mixed oxide of zinc and tin.

11. A glazing panel in accordance with claim 1, the base antireflective layer consisting essentially of mixed oxides of zinc and tin.

12. A glazing panel in accordance with claim 1, wherein the top antireflective layer comprises at least one layer comprising a mixed oxide of zinc and tin.

13. A glazing panel in accordance with claim 1, wherein the top coat includes at least one of the following (a) through (d):
   (a) the top coat layer consists essentially of a material selected from the group consisting of nitrides and oxynitrides of the elements of groups IVb, Vb and VIb of the periodic table;
   (b) the top coat layer consists essentially of a material selected from the group consisting of titanium nitride, chromium nitride, zirconium nitride, titanium oxynitride, chromium oxynitride, zirconium oxynitride and mixtures thereof;
   (c) the top coat layer comprises titanium nitride;
   (d) the top coat layer has a geometrical thickness in the range 15 to 50 Å.

14. A glazing panel in accordance with claim 1, further including a
   barrier layer between the infra-red reflecting layer and the top antireflective layer.

15. A glazing panel in accordance with claim 14, in which the barrier layer includes at least one of the following (a) through (c):
   (a) the barrier layer comprises a first barrier layer in substantially metallic form and an overlying second barrier layer of a different composition from the first barrier layer which is in a form selected from the group consisting of oxides, sub-stoichiometric oxides, nitrides, sub-stoichiometric nitrides, oxynitrides and sub-stoichiometric oxynitrides;
   4(b) the barrier layer comprises a first barrier layer comprising nickel and chromium and an overlying second barrier layer comprising titanium;
   (c) a barrier layer selected from the group consisting of a barrier layer comprising nickel and chromium, a barrier layer comprising titanium, and a barrier layer comprising a first barrier layer comprising nickel and chromium and an overlying second barrier layer comprising titanium.

16. A glazing panel in accordance with claim 1, including:
   the base antireflective layer comprising at least one layer comprising a mixed oxide of zinc and tin;
   a barrier layer between the infra-red reflecting layer and the top antireflective layer;
   the top antireflective layer consisting essentially of mixed oxides of zinc and tin; and
   the top coat layer comprises at least one material selected from the group consisting of nitrides, oxynitrides, carbides, oxycarbides and carbonitrides of the elements of groups IVb, Vb and VIb of the periodic table.

17. A glazing panel in accordance with claim 1, in which the glazing panel consists essentially of, in sequence,
   a glass substrate
   a base antireflective layer consisting essentially of mixed oxides of zinc and tin;
   an infra-red reflecting layer,
   a barrier layer selected from the group consisting of a barrier layer comprising nickel and chromium, a barrier layer comprising titanium, and a barrier layer comprising a first barrier layer comprising nickel and chromium and an overlying second barrier layer comprising titanium;

a top antireflective layer consisting essentially of mixed oxides of zinc and tin; and a top coat layer consisting essentially of titanium nitride.

18. A glazing panel in accordance with claim 1 wherein the top coat layer has a geometrical thickness in the range 20 to 40 Å.

19. Use of a top coat layer having a geometrical thickness of greater than or equal to 10 Å and less than or equal to 100 Å which comprises at least one material selected from the group consisting of nitrides, oxyniftides, oxycarbides and carbonitrides of the elements of groups IVb, Vb and VIb of the periodic table to enhance chemical durability before heat treatment of a heat treatable coated glazing panel having at least one metallic infra red reflecting coating layer sandwiched between dielectric layers, wherein the at least one metallic infra red reflecting coating layer is deposited on a glass substrate and the top coat layer is deposited thereon.

20. A glazing panel carrying a coating stack comprising in sequence at least:
  a glass substrate
  a base antireflective layer
  an infra-red reflecting layer
  a top antireflective layer
  a top coat layer in which the glazing panel is adapted to be heat treated in which the top coat layer comprises at least one material selected from the group consisting of carbides of the elements of groups IVb, Vb and VIb of the periodic table and in which the top coat layer has a geometrical thickness in the range of 20 to 40 Å.

* * * * *

UNITED STATES PATENT AND TRADEMARK OFFICE
CERTIFICATE OF CORRECTION

PATENT NO. : 7,494,717 B2
APPLICATION NO. : 10/545230
DATED : February 24, 2009
INVENTOR(S) : Daniel Decroupet et al.

It is certified that error appears in the above-identified patent and that said Letters Patent is hereby corrected as shown below:

Column 1, line 36, "chemical durability of a coatings stack The use of metallic" should read -- chemical durability of a coatings stack. The use of metallic --.

Signed and Sealed this

Eighteenth Day of August, 2009

David J. Kappos
*Director of the United States Patent and Trademark Office*